(12) United States Patent
Ireland

(10) Patent No.: US 6,479,378 B1
(45) Date of Patent: Nov. 12, 2002

(54) PROCESS FOR FORMING ELECTRICAL INTERCONNECTS IN INTEGRATED CIRCUITS

(75) Inventor: Philip J. Ireland, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/944,483

(22) Filed: Aug. 30, 2001

Related U.S. Application Data

(63) Continuation of application No. 09/333,796, filed on Jun. 15, 1999, now Pat. No. 6,365,489.

(51) Int. Cl.⁷ .................................................. H01L 21/4763
(52) U.S. Cl. ................... 438/618; 438/619; 438/421; 438/422; 438/637
(58) Field of Search ......................... 438/618–619, 438/622, 421–422, 637–640, 624, 672–673, 675, 760

(56) References Cited

U.S. PATENT DOCUMENTS

| | | | |
|---|---|---|---|
| 2,929,753 A | 3/1960 | Noyce | |
| 3,837,907 A | 9/1974 | Berglund et al. | |
| 3,873,373 A | 3/1975 | Hill | |
| 3,985,597 A | 10/1976 | Zielinski | |
| 4,149,301 A | 4/1979 | Cook | |
| 4,411,708 A | 10/1983 | Winhan | |
| 4,571,819 A | 2/1986 | Rogers et al. | |
| 4,721,689 A | 1/1988 | Chaloux, Jr. et al. | |
| 4,807,016 A | 2/1989 | Douglas | |
| 4,839,306 A | 6/1989 | Wakamatsu | |
| 4,839,715 A | 6/1989 | Gajda et al. | |
| 4,840,923 A | 6/1989 | Flagello et al. | |
| 4,920,403 A | 4/1990 | Chow et al. | |
| 5,001,079 A | 3/1991 | Van Laarhoven et al. | |
| 5,004,704 A | 4/1991 | Maeda et al. | |
| 5,010,039 A | 4/1991 | Ku et al. | |
| 5,136,358 A | 8/1992 | Sakai et al. | |
| 5,166,101 A | 11/1992 | Lee et al. | |
| 5,225,372 A | 7/1993 | Savkar et al. | |
| 5,275,972 A | 1/1994 | Ogawa et al. | |
| 5,278,103 A * | 1/1994 | Mallon et al. | 438/632 |
| 5,648,175 A | 7/1997 | Russell et al. | |
| 5,656,556 A | 8/1997 | Yang | |
| 5,677,241 A | 10/1997 | Manning | |
| 5,814,555 A | 9/1998 | Bandyopadhyay et al. | |
| 5,880,797 A | 3/1999 | Yamada et al. | |
| 6,030,860 A | 2/2000 | Gardner et al. | |
| 6,031,286 A * | 2/2000 | Levine et al. | 257/622 |
| 6,107,205 A | 8/2000 | Yu | |

FOREIGN PATENT DOCUMENTS

| | | |
|---|---|---|
| JP | 1-296641 | 11/1999 |

OTHER PUBLICATIONS

F. S. Becker S. Rohl, Low Pressure Deposition of Doped SiO2 by Pyrolysis of Tetraethylorthosilicate (TEOS), Solid–State Science and Technology, Nov. 1987, vol. 134, No. 11, pp. 2923–2931.

B.L. Chin, E.P. van de Ven, Plasma TEOS Process for Interlayer Dielectric Applications, Solid State Technology, Apr. 1988, pp. 119–122.

* cited by examiner

*Primary Examiner*—Tuan H. Nguyen
*Assistant Examiner*—Thanh Nguyen
(74) *Attorney, Agent, or Firm*—TraskBritt

(57) ABSTRACT

An integrated circuit having at least one electrical interconnect for connecting at least two components and a process for forming the same are disclosed.

26 Claims, 4 Drawing Sheets

PROCESS FOR FORMING ELECTRICAL INTERCONNECTS IN INTEGRATED CIRCUITS

CROSS-REFERENCE TO RELATED APPLICATION

This application is a continuation of application Ser. No. 09/333,796, filed Jun. 15, 1999 now U.S. Pat. No. 6,365,489, pending.

BACKGROUND OF THE INVENTION

1. Field of the Invention

This invention relates generally to the manufacture of silicon integrated circuits (ICs). More specifically, the present invention relates to integrated circuits utilizing an electrical interconnect system in multi-level conductor-type integrated circuits of high component density and the processes for making the same.

2. State of the Art

In recent years with increasing component density of very large scale integrated circuits, it has become necessary to develop multi-level conductor technologies to provide the required number of electrical interconnects between both active and passive devices fabricated on silicon substrates using state of the art planar processing. These multi-level conductor technologies are also alternatively referred to as multi-level metal (MLM) processing. But as used herein, multi-level conductor (MLC) processing is generic to either metal deposition, polycrystalline silicon deposition, or polysilicon deposition used in the formation of conductive interconnecting paths at different levels or planes formed on an integrated circuit substrate, such levels or planes containing previously formed active and passive devices located therein.

As generally understood in the art and as used herein, a "level" including a conductor or metallization is added atop a semiconductor substrate by growing or depositing an insulating layer, such as silicon dioxide or silicon nitride, over a previously formed underlayer of metal and forming an opening or "via" in this insulating layer for receiving a conductor or metallization to extend therethrough from another conductor or metallization subsequently formed as an upper layer deposited on the surface of the insulating layer. Thus, the mere addition of a single "level" of conductor over a previously formed conductive pattern will include the process steps of (1) the formation of an insulating layer, (2) the formation of a photoresist etch mask on the surface of the insulating layer, (3) the exposure of the etch mask to a selected etchant to create a via in the insulating layer, (4) the removal of the photoresist etch mask, and (5) deposition of an additional layer of metallization or polysilicon in order to provide an electrical interconnect through the previously formed via in the dielectric layer and conductor connected thereto located on the insulating layer.

A number of prior art electrical interconnect systems and processes for the formation thereof have been used in the integrated circuit art, but none such as the electrical interconnect systems of the present invention. For example, U.S. Pat. No. 5,001,079 discloses a method of manufacturing a semiconductor device by forming insulating side walls with voids below overhangs. This method illustrates insulating material layers of silicon oxide, silicon nitride or silicon oxynitride which are deposited by plasma enhanced chemical vapor deposition (CVD), a process known in the art, for the formation of overhanging portions thereof having voids thereinbetween. Such voids are subsequently etched to expose gently sloping portions for further insulation to be added therein.

U.S. Pat. No. 5,278,103 illustrates a method for the controlled formation of voids in doped glass dielectric films wherein the doped glass may include boron phosphorous silicate (BPSG) deposited in predetermined thicknesses. BPSG is used for its dielectric properties, its melting point, and for deposition by CVD processes. The controlled formation of voids in the BPSG is used to minimize the effect of parasitic capacitance between conductors located therein.

U.S. Pat. No. 5,166,101 illustrates another method for forming a BPSG layer on a semiconductor wafer using predetermined CVD deposition and plasma-assisted CVD deposition processes to form void-free BPSG layers over stepped surfaces of a semiconductor wafer.

As current semiconductor device performance requirements continue to increase component packing densities of the semiconductor device, this, in turn, increases the complexity and cost of multi-level conductor formation processes requiring further levels of conductors to multi-level conductor integrated circuits. This typically results in lower wafer processing yields, affects semiconductor device reliability, and increases production costs for such semiconductor devices.

What is needed and not illustrated in the prior art described herein are multi-level conductor interconnections and processes for the manufacture thereof in integrated circuit semiconductor devices wherein the electrical interconnections and the density thereof is increased without the addition of another "level" of circuitry for conductors or metallization to the semiconductor device. This increased density of multi-level conductor interconnections without the addition of at least one additional "level" further requires the use of areas of the integrated circuit semiconductor device not presently used for electrical interconnection, requires the use of improved oxide formation and conductor formation processes for maximizing component packing density on each layer of the semiconductor device, and requires minimizing the number of individual process steps for manufacturing. The present invention described hereinafter is directed to such requirements while allowing for the substantially simultaneous formation of electrical interconnections.

SUMMARY OF THE INVENTION

In a preferred embodiment of the present invention, a semiconductor device comprises a substrate, a plurality of conductive strips located on said substrate extending along at least a portion of the length of the substrate, a layer of doped glass formed over the substrate and plurality of conductive strips, the layer of doped glass having an elongated passageway formed therein between the conductive strips, and a conductive material located in the elongated passageway located between the conductive strips forming at least one electrical interconnect through the layer of doped glass to electrically connect at least two components of the integrated circuit.

In another embodiment of the present invention, an integrated circuit semiconductor device having regions comprises a semiconductor substrate, a plurality of conductive strips, a layer of dielectric material covering portions of the semiconductor substrate and the conductive strips located thereon, the dielectric material including an elongated passageway located therein extending between adjacent conductive strips of the plurality of conductive strips, a conductive material located in the elongated passageway of the dielectric material, and at least one electrical interconnect formed between the two regions of the integrated circuit semiconductor device by a portion of the conductive material.

The present invention also includes a process for forming electrical interconnections in integrated circuit semiconductor devices by creating subresolution features between the circuitry thereof using doped glass. The process of the present invention includes forming adjacent conductive strips on a substrate surface, depositing a doped glass layer over at least a portion of the adjacent conductive strips and a portion of the surface of the substrate having a thickness proportional to the spacing of the adjacent conductive strips, flowing the doped glass layer around the conductive strips located on the surface of the substrate to form at least one elongated passageway coextensive with a portion of the length of the conductive strips, reflowing the deposited doped glass layer to smooth the doped glass layer and to position the at least one elongated passageway, forming at least one opening in the reflowed doped glass layer in the at least one elongated passageway, and filling the at least one elongated passageway formed in the reflowed doped glass layer with a conductive material through the at least one opening and along at least a portion of the length of the elongated passageway to produce at least one electrical interconnect between at least two regions of the integrated circuit.

Figure 1A:
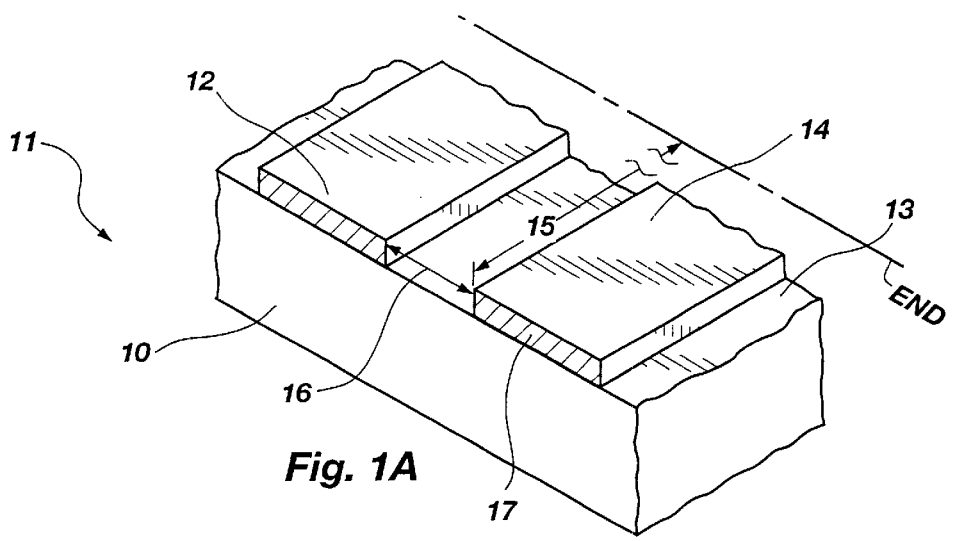
FIGS. 1A–1C are a series of abbreviated isometric views illustrating the formation of at least one elongated passageway which is formed and filled to create at least one electrical interconnect in accordance with the present invention.
Figure 1B:
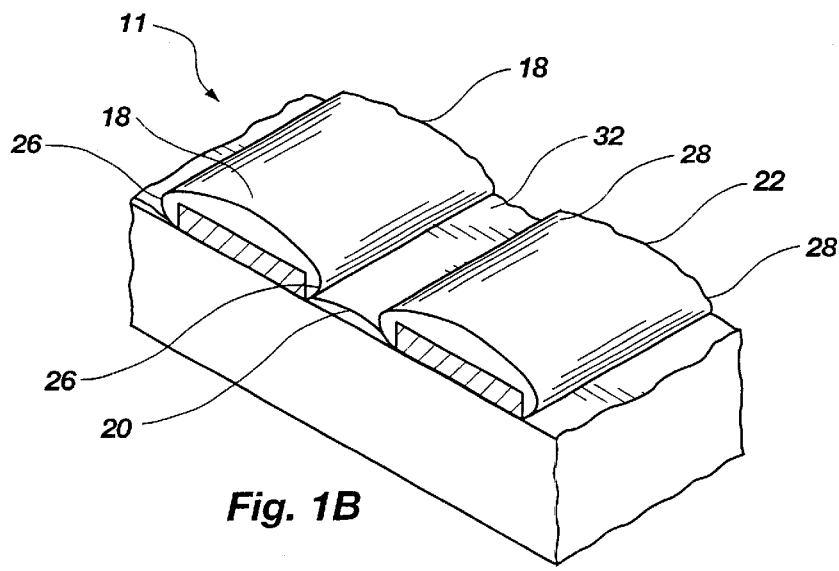

The present invention will be better understood when the drawings are taken in conjunction with the detailed description of the invention hereinafter.

DETAILED DESCRIPTION OF THE INVENTION

As illustrated in sequence in drawing FIGS. 1A through 4, the integrated circuit semiconductor device 11 of the present invention includes at least two regions 104,106 or at least two components further described hereinbelow. The integrated circuit semiconductor device 11 of the present invention is also provided in combination or as a system of inter-level electrical interconnections in other embodiments. The integrated circuit semiconductor device 11 comprises a semiconductor substrate 10, a plurality of adjacent, substantially parallel conductive strips 12,14 located on the substrate 10, a layer of dielectric material 18,20,22,56 covering at least portions of the substrate 10 and strips 12, 14, a conductive material 60 located in an elongated passageway 52, 54, of the dielectric material, and at least one electrical interconnect 66,82. In other embodiments of the present invention, the plurality of adjacent, substantially parallel conductive strips 12,14 comprises either a plurality of adjacent conductive strips or at least two adjacent conductive strips. In other embodiments of the present invention, the conductive material 60 comprises at least one elongated conductor formed of a suitable conductive material. Also, in other embodiments of the present invention, the layer of dielectric material 18,20,22,56 is at least one layer of doped glass as described hereinbelow.

The semiconductor substrate 10, shown in drawing FIGS. 1A through 3D, is formed of suitable materials known in the art, such as silicon. The semiconductor substrate 10 includes an upper surface 13 upon which levels of conductive strips, circuitry, and components are constructed through known processes using lithographic techniques known in the art. The semiconductor substrate 10 supports the components hereinafter described being suitable for multi-level metal (MLM) processing or multi-level conductor (MLC) processing as described herein.

The plurality of adjacent, substantially parallel conductive strips 12,14, at least a pair of conductive strips 12, 14, shown in drawing FIGS. 1A through 4, is disposed on and is operatively connected to the substrate surface 13. Each adjacent conductive strip 12,14 is constructed of either polysilicon conductors or other suitable materials known in the art. The conductive strips have a length 15,46 measured from one end 17 to an opposite end (not shown). As is known in the art, the plurality of adjacent, substantially parallel conductive strips 12,14 can be formed by suitable chemical vapor deposition (CVD) processes (i.e. low pressure CVD), by sputtering, etc. Chemical vapor deposition is a well-known, preferred method of deposition providing coverage of exterior surfaces, inner surfaces, and contact openings that can be used to form insulative and conductive layers as will be further discussed below.

As shown in drawing FIGS. 1A through 3D, the layer of dielectric material 18,20,22,56 is deposited over the substrate upper surface 13 and over and around the plurality of adjacent, substantially parallel conductive strips 12,14. Additional layers of dielectric material (not shown) can also be deposited following the deposition and reflow of the layer shown in the figures. These processes are accomplished again by processes known in the art, such as CVD (i.e. low pressure, plasma-enhanced, etc.) as described below.

The layer of dielectric material 18,20,22,56 can be selected from the group of materials comprising borophosphosilicate glass (BP SG), borosilicate glass (B SG), phosphosilicate glass (PSG), silicon dioxide, and others known in the art. However, any desired suitable layer of material may be used as the dielectric material 18,20,22,56. In a preferred embodiment of the present invention, BPSG is used as the doped glass dielectric layer 18,20,22,56 as described below. BPSG provides an excellent dielectric material with a melting point made significantly lower than that of regular glass or other dielectric materials, allowing it to be used in a high temperature reflow process which melts and smooths the BPSG surface 57 without damaging other semiconductor components of the integrated circuit semiconductor device 11.

The dielectric layer 18,20,22,56 (i.e., BPSG layer) is deposited on the plurality of conductive strips 12,14 and the upper surface 13 of the substrate 10 to a deposited thickness 35 sufficient to create at least one elongated passageway 42,52,54, as shown in FIGS. 1C through 3D. It is critical that the deposited thickness 35 be proportional to a spacing 16 defined between at least two of the plurality of adjacent conductive strips 12,14 as is taught in U.S. Pat. No. 5,278,103 to Mallon et al., which is incorporated herein by reference, to illustrate the controlled formation of voids in BPSG layer and formation processes therefor. If the deposited thickness 35 is not sufficiently thick to be proportional to this spacing 16, an open channel-type groove is formed (not shown) instead of the elongated passageway 42,52,54. Additionally, if the adjacent conductive strips 12,14 are spaced too far apart, it is not possible for the deposited thickness 35 of the deposited dielectric layer 18,20,22,56 to overlap to form the elongated passageway 42,52,54, or void. If the spacing of the conductive strips 12, 14 is too great, the thickness dimension 35 of the dielectric material 18,20,22, 56 required may be so large as to defeat the purpose of having inter-level connections in the first place.

The at least one elongated passageway 42,52,54, or void, in the dielectric material 18,20,22,56 is formed by at least one set of opposing, contoured, merging dielectric surfaces 26,28,38,40 overhanging the substrate surface 13 until the surfaces contact. The formation of the at least one elongated passageway 42,52,54 is shown in drawing FIGS. 1A through 1C as the dielectric material 18,20,22,56 is deposited to the desired thickness 35 during a CVD process or other suitable process. The opposing, contoured, merging dielectric surfaces 26,28,38,40 are located between at least two of the plurality of adjacent, substantially parallel conductive strips 12,14, as shown in drawing FIGS. 1C through 3D, to define the at least one elongated passageway 42,52,54 located therein. The elongated passageway 42,52,54 is substantially enclosed within the layer of dielectric material 18,20,22,56 along the length 15 in a direction substantially parallel to the plurality of adjacent, substantially parallel conductive strips 12,14 and has at least one opening 70 leading into the elongated passageway 42,52,54. The at least one opening 70 is required for the formation of the electrical interconnect system discussed hereafter.

Figure 2A:
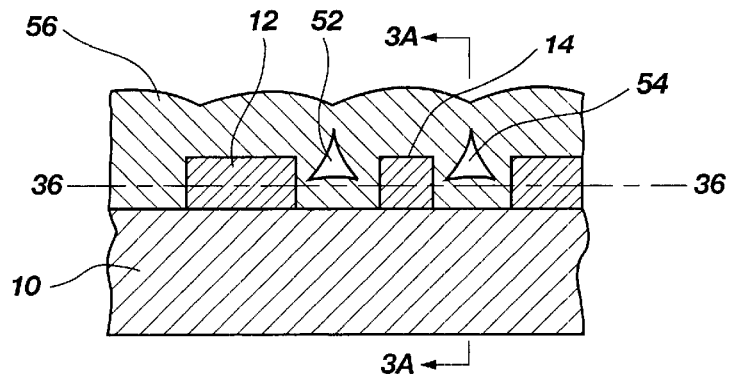
FIGS. 2A–2D are a series of abbreviated schematic cross-sectional views taken along an X-axis direction or plane of the embodiment in FIGS. 1A–1C showing the device's structure and fabrication process in accordance with the present invention.
Figure 2B:
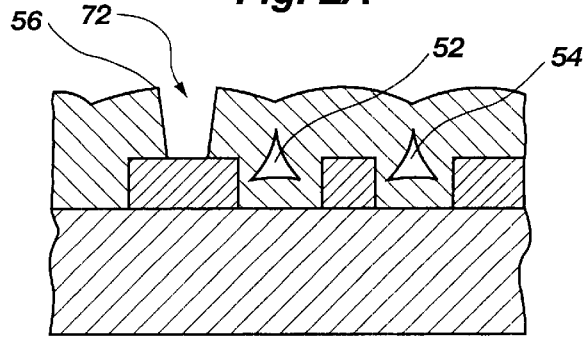
Figure 2C:
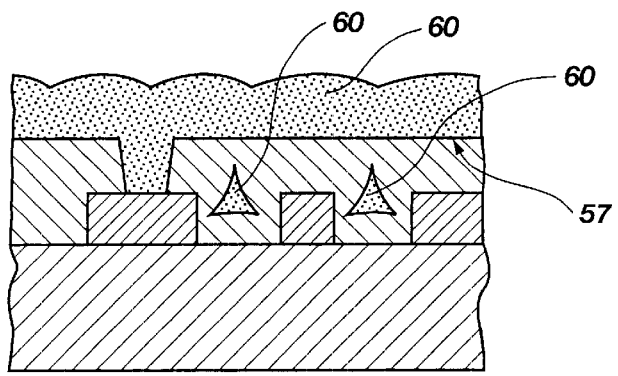
Figure 2D:
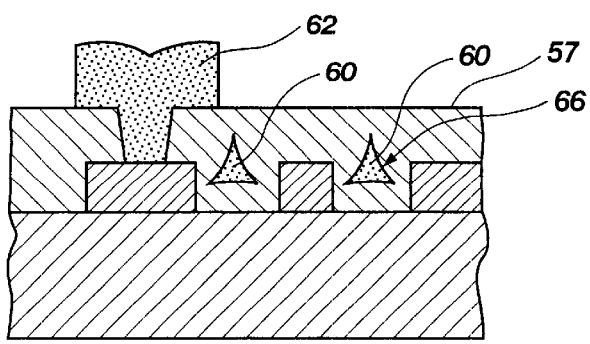
Figure 3A:
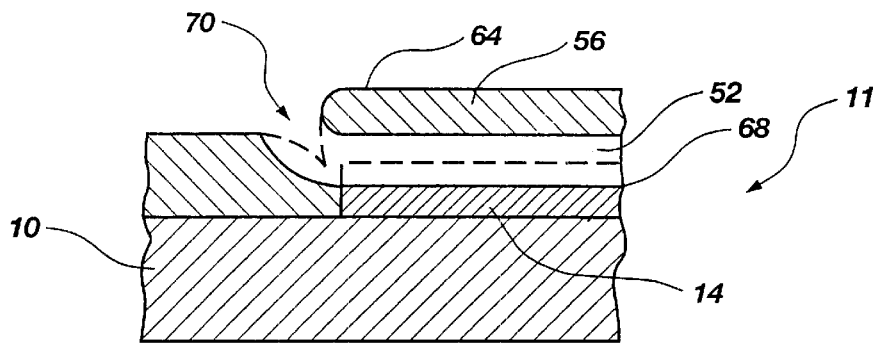
FIGS. 3A–3D are a series of abbreviated schematic cross-sectional views taken along a Y-axis direction or plane of the embodiment in FIGS. 2A–2D showing the device's structure and fabrication process in accordance with the present invention.
Figure 3B:
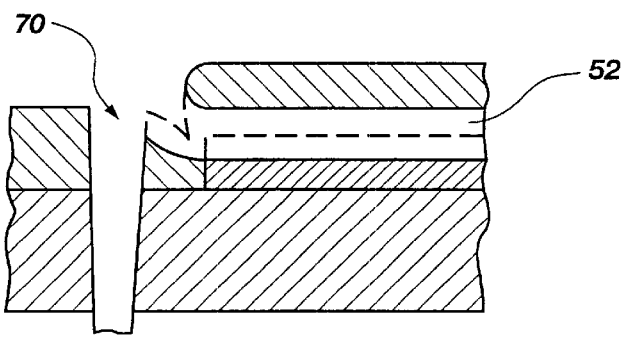
Figure 3C:
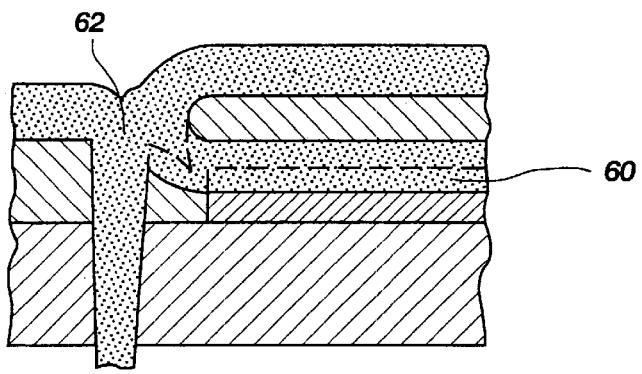
Figure 3D:
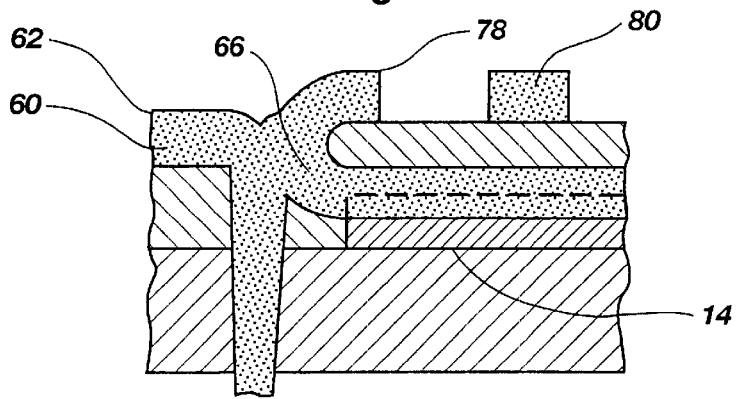
Figure 4:
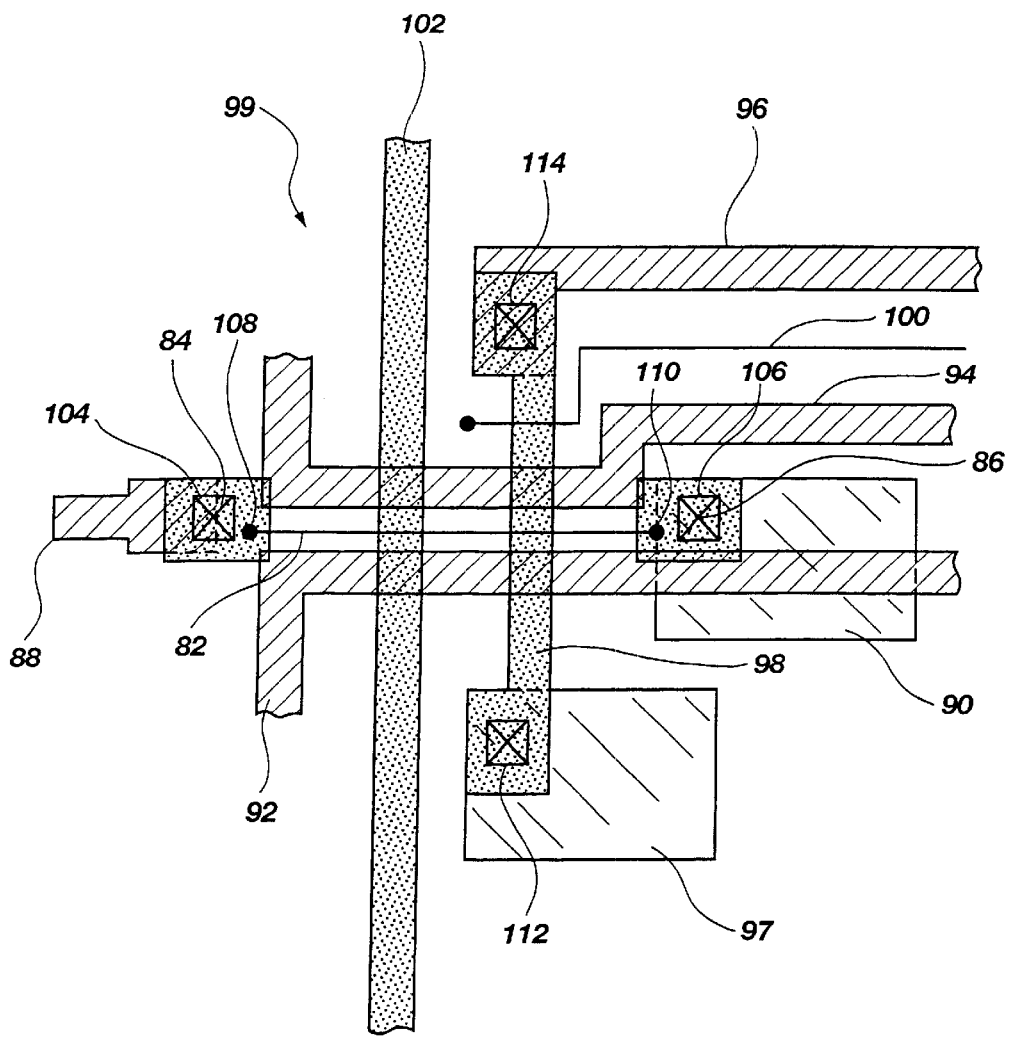
FIG. 4 is a plan view of an embodiment of the present invention showing a typical interconnect scheme utilizing the present invention.

The integrated circuit semiconductor device 11 further comprises conductive material 60 substantially filling an elongated passageway 42,52,54 through the at least one opening 70 as is shown in drawing FIGS. 2C through 2D and drawing FIGS. 3C through 4. The conductive material 60 is selected from the group of materials comprising doped polysilicon, pure metals, metals, alloys thereof, and metal suicides, and other suitable materials known in the art. It is contemplated that the conductive material 60 be deposited and formed by chemical vapor deposition (CVD) or by any other suitable process known in the art allowing the conductive material 60 to form in the substantially closed passageway 42,52,54, the at least one elongated passageway, located within the dielectric material/doped glass layer 18,20,22,56 and to form simultaneously with processes forming metallization interconnections 62 known in the art.

Finally, the at least one electrical interconnect 66,82, or subresolution feature referred to as such since the electrical interconnect 66,82 is too small to be formed by conventional lithographic techniques, as shown in drawing FIGS. 2C through 2D and drawing FIGS. 3C through 4, is formed between at least two of the regions 104,106 by the conductive material 60 substantially filling the elongated passageway 42,52,54 formed through the layer of dielectric material 18,20,22,56 as described herein. As the chemical vapor deposition (CVD), or other suitable process, forms the conductive material 60, the conductive material deposits on an inner surface 68 of the at least one elongated passageway 42,52,54, thereby creating the at least one electrical interconnect 66,82 which, in turn, forms at least one additional "level" for semiconductor component interconnection while maximizing the component package density of the integrated circuit semiconductor device 11. This "level" then is capable of being located in or proximate to the plane 36—36 of the corresponding adjacent conductive strips 12,14 as shown in drawing FIG. 2A. In a preferred embodiment, the at least one elongated passageway 42,52,54 can be located between corresponding adjacent conductive strips 12,14 and is capable of receiving the conductive material 60 simultaneously with forming an interconnection 62 at the least one electrical interconnect 66,82. The at least one electrical interconnect 66,82 thereby satisfies the needs in the art by connecting the regions 104,106 in at least one level of a multi-level integrated circuit semiconductor device structure 99 (see FIG. 4) to form multi-level electrical interconnections approximately simultaneously formed therein with metallization or other processes used to form interconnection 62.

Figure 1C:
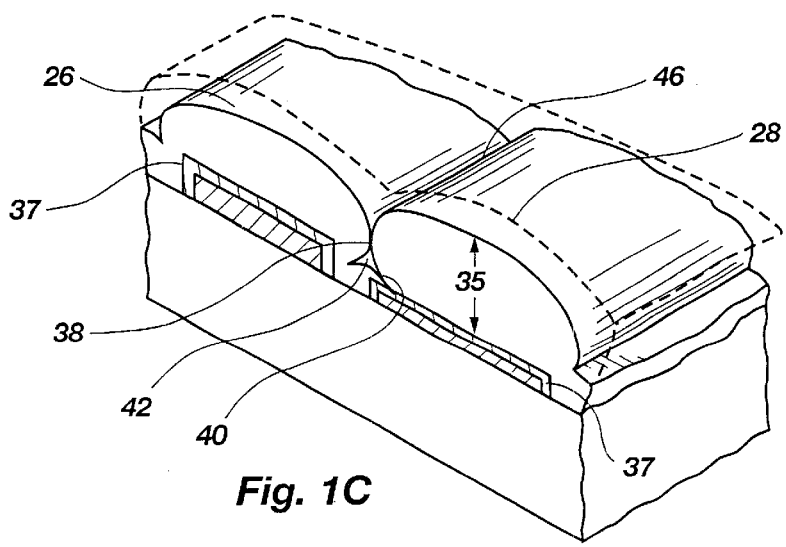

It is contemplated that in other embodiments, at least two elongated passageways 42,52,54 can be located between adjacent, substantially parallel conductive strips 12,14 and are capable of receiving the conductive material 60 to form the at least one electrical interconnect 66,82 and to thereby create additional semiconductor component interconnections, depending upon the requirements of the circuitry of the integrated circuit semiconductor device 11. Furthermore, drawing FIG. 1C illustrates an oxide layer 37 formed and located between the layer of dielectric material 18,20,22,56 and the plurality of adjacent, substantially parallel conductive strips 12,14 to form an additional insulating surface using processes known in the art. The oxide layer 37 can be a low temperature deposited oxide layer formed by CVD processes, for example.

The at least one opening 70, shown in drawing FIGS. 1C through 3D, can be formed in the contoured, merging dielectric surfaces 26,28,38,40 at the ends of the plurality of adjacent conductive strips 12,14 prior to or during the reflow process due to the properties of the dielectric layer 18,20, 22,56 and its deposition on and around the corresponding adjacent conductive strips 12,14. The at least one opening 70 can then be connected to at least one via 72 which can be formed using conventional masking and etching processes. The at least one opening 70 can also be formed by the direct connection of the at least one via 72 to the at least one elongated passageway 42,52,54 formed by processes known in the art. The connection of the at least one opening 70 to the at least one via 72 directs the conductive material 60 into the elongated passageway 42,52,54 simultaneously with the fabrication process to form interconnection 62. Also, drawing FIGS. 2D and 3D illustrate that the top level of interconnection 62 may be masked and etched using conventional processes to form any desired pattern 78,80 needed above the adjacent conductive strips 12,14 for receiving external contacts to the integrated circuit semiconductor device 11,99.

As illustrated in drawing FIG. 4, at least one elongated passageway 42,52,54 is directed substantially parallel to the plurality of conductive strips 12,14 and the multi-level electrical interconnections are directed in parallel and perpendicular directions to the plurality of conductive strips 12,14 to connect the at least two components in at least two levels of the multilevel integrated circuit semiconductor device 99. This inter-level electrical interconnect, therefore, can be used to connect components, for example, in one region 104 of the integrated circuit semiconductor device 11,99 to components in another region 106 of the integrated circuit semiconductor device 11,99 without requiring a separate additional "level" of MLC metallization.

Drawing FIG. 4 illustrates a typical topographical layout with the at least one electrical interconnect 82 extending between a contact pad 84 and a contact pad 86. The contact pad 84 may typically be connected to an underlying external polysilicon line 88, whereas the right side contact pad 86 may typically be connected to an underlying contact pad 90. The exemplary topographical layout in drawing FIG. 4 may further include additional polysilicon conductors 92, 94, and 96, as well as a metal conductive strip 98 extending from one end of the polysilicon strip 96 to another lower contact pad 97. Some elongated passageways, such as the passageway 100, may not be used at all, and other conductors, such as crossover conductor 102 may cross over the entire area without making any contact with any of the conductive strips shown therein. Drawing FIG. 4 is representative of a conventional integrated circuit topographical layout in which the at least one elongated passageway 42, 52, 54 and the conductive material 60 contained therein (the at least one electrical interconnect 66,82) are extended by a length dimension between contact pads 84 and 86 to make electrical contact between various spaced-apart components within the integrated circuit structure of the integrated circuit semiconductor device 99.

As illustrated in drawing FIG. 4, the contact pads 90 and 97 are the lowermost regions in the integrated circuit (IC) structure and may be diffusions, depositions, or ion-implanted regions which serve as the source and drain for MOS transistors in the silicon substrate. Moving vertically upward from the lowermost regions and with respect to "levels", the figure shows the conductive strips 88, 92, 94, and 96 and then the crossover conductors 98 and 102 which are at the same level of and are formed with the rectangularly shaped enclosed regions 104 and 106 which surround the two vertical contact pads 84 and 86, respectively.

Thus, end nodes or termination points 108 and 110 of the at least one electrical interconnect 66,82 are electrically connected to the enclosed heavily doped regions 104 and 106, respectively, and then the two vertical contact pads 84 and 86 continue this electrical path from the polysilicon conductor or line 88 to the MOS transistor contact pad 90. Similarly, the MOS transistor contact pad 97 is connected up through the vertical interconnect 112 and through the metal crossover conductor 98 and then down through the vertical interconnect 114 to the lower level polysilicon conductor 96. Illustrated in drawing FIG. 4 is at least one electrical interconnect 82 extending between the nodes 108 and 110 and making use of the inter-level path to extend between the interconnect level of the conductors 92, 94, and 96, the interconnect level of crossover conductors 98 and 102, and the heavily doped rectangular enclosed regions 104 and 106.

The present invention also includes a process for forming electrical interconnect 66,82 in integrated circuit semiconductor devices 11 by creating the subresolution features 66,82 in a doped glass layer 18,20,22,56, or insulating layer, using the layer's flow characteristics. The features 66, 82 are referred to as subresolution features as they are too small in dimension to be accurately formed by the lithographic techniques used to form the circuitry of the integrated circuit semiconductor device 11,99. The process, described sequentially in drawing FIGS. 1A through 3D, comprises (1) forming adjacent conductive strips 12,14 having a space 16 therebetween of suitable dielectric material on a surface 13 of substrate 10 by processes known in the art, such as photolithography, etching, implanting, diffusion, CVD, and metallization. For example, adjacent conductive strips 12,14 can be formed having a height of 3000–4000 angstroms high and having a spacing of 0.5–1.0 microns from center to center of the adjacent conductive strips 12,14.

Next in the process, a doped glass layer 18,20,22,56, or insulating layer, is deposited over the adjacent conductive strips 12,14 and the substrate surface 13 to a thickness 35 proportional to the spacing 16 therebetween the conductive strips 12,14 to form coated strips 12,14 and coated substrate surfaces 32. Chemical vapor deposition processes, such as plasma enhanced CVD, low pressure CVD, or other deposition processes, are used to deposit the doped glass layer. Opposing, contoured dielectric surfaces 26,28,38,40 of the deposited doped glass layer 18,20,22,56 are merged around the coated strips 12,14 and over the corresponding coated substrate surface 32 to form at least one elongated passageway 42,52,54 running coextensive with a length 15 of the coated conductive strips 12,14.

For example, with the ranges of dimensions given herein for the conductive strips 12,14 using CVD processes, a first layer of BPSG having appropriate concentration percentages of boron and phosphorus and having a thickness of 10,000–15,000 angstroms will properly coat and cause merging surfaces 26,28,38,40 to form the desired at least one elongated passageway 42,52,54, or void, in the doped glass layer 18,20,22,56. Typical concentration percentages will range from 3–5 weight percent Boron concentration and 3–6 weight percent phosphorus concentration. If a higher density is required and lower reflow/annealing temperatures are required, then the percentage concentration of Boron should be increased above 5% so that reflow temperatures can drop below 800° C. The use of processes such as CVD and the flow characteristics of the doped glass layer 18,20,22,56, such as BPSG, create the ability to form the at least one elongated passageway 42,52,54 and, when filled with conductive material, the at least one electrical interconnect 66,82.

The deposited doped glass layer 18,20,22,56 is then reflowed by processes known in the art in order to smooth the surface 57 of deposited doped glass layer 18,20,22,56 without substantially affecting the position of the at least one elongated passageway 42,52,54 within the doped glass layer 18,20,22,56. For example, the at least one elongated passageway 42,52,54 can be formed directly in line with and between corresponding adjacent conductive strips 12,14 as long as a sufficient coated substrate surface 32 covers the substrate surface 13, or the at least one elongated passageway 42,52,54 can be offset so as to be formed above the plane 36—36 of the adjacent conductive strips 12,14 in a manner similar to that illustrated in drawing FIGS. 2A–2D. Reflow or annealing processes, especially for BPSG layers, are typically performed at a temperature of about 900° C. and will smooth the surface for later depositions. These processes also contemplate the use of rapid thermal processing for the recrystallization of surface films. Reflowing results in a position of the at least one elongated passageway 42,52,54 at a distance from the conductive strips 12,14 and the coated substrate therebetween sufficient to prevent damage to the coated substrate surfaces 32 and the conductive strips 12,14 when the at least one electrical interconnect 66,82 is formed. The reflowing process results allow for sufficient insulation between conductive strips 12,14 and electrical interconnect 66,82 so as to prevent interference or electrical shortages.

Next in the process, at least one opening 70 is formed in the at least one elongated passageway 42,52,54 due either to the flow characteristics of the doped glass layer 18,20,22,56 and the structure of the adjacent conductive strips 12,14 during the reflow process or due to the creation of at least one via 72 heretofore described. Finally, the at least one elongated passageway 42,52,54 is filled with a conductive material 60 through the at least one opening 70 and along the length 15 thereof to produce at least one electrical interconnect 66,82, or subresolution feature, between at least two regions 104,106 of the integrated circuit semiconductor device 11,99. This filling process for the conductive material 60 includes using CVD processes (i.e. low pressure CVD) or other processes known in the art and as discussed above.

If further doped glass layers (not shown) are required, then at least one more doped glass layer (not shown) can be deposited and smoothed as described herein over the first deposited and reflowed doped glass layer 18,20,22,56 using CVD and high temperature reflow processes known in the art. Such a high temperature process typically occurs at a temperature between 600° C. and 800° C. In addition, if an oxide layer 37 is required, then the oxide layer 37 can be deposited over the spaced and formed adjacent conductive strips 12,14 prior to the act of depositing the doped glass layer 18,20,22,56 as shown in drawing FIG. 1C, the oxide layer 37 having a height of approximately 2000 angstroms and deposited by low pressure CVD processes.

During the process of filling the at least one elongated passageway 42,52,54 as shown in drawing FIGS. 2B through 2D and drawing FIGS. 3B through 3D with a conductive material, the at least one via 72 is connected to the at least one opening 70 to direct the conductive material thereinto and to elongated passageway 42,52,54 by suitable processes, such as CVD, simultaneously while forming interconnection 62. This simultaneous filling-formation process simplifies the fabrication process. As discussed above, the at least one opening 70 can also be formed by the connection of the at least one via 72 prior to filling the at least one elongated passageway 42,52,54. These process acts thereby form multi-level electrical interconnections by approximately or substantially simultaneously connecting the at least one electrical interconnect 66,82 with the at least two regions 104,106 in at least one level of the integrated circuit semiconductor device 11,99. Further conventional processes, such as etching, are used to shape and form the component pattern structures 78,80, depending upon the requirements of the circuitry of the integrated semiconductor device 11,99.

It will also be appreciated by one of ordinary skill in the art that one or more features of any of the illustrated embodiments may be combined with one or more features from another to form yet another combination within the scope of the invention as described and claimed herein. Thus, while certain representative embodiments and details have been shown for purposes of illustrating the invention, it will be apparent to those skilled in the art that various changes in the invention disclosed herein may be made without departing from the scope of the invention, which is defined in the appended claims.

What is claimed is:

1. A process for forming electrical interconnects in integrated circuits comprising:

forming spaced adjacent conductive strips on a substrate surface;

depositing a doped glass layer over said spaced adjacent conductive strips and said substrate surface to a thickness proportional to said spacing to form coated strips and coated substrate surfaces, said doped glass layer is selected from the group consisting of borophosphosilica glass, borosilicate glass, phosphosilicate glass, and silicon dioxide;

merging opposing contoured surfaces of said deposited doped glass layer around said coated strips and over said coated substrate surfaces to form at least one elongated passageway running coextensive with a length of said coated strips;

reflowing said deposited doped glass layer to smooth said deposited doped glass layer and to position said at least one elongated passageway;

forming at least one opening in said at least one elongated passageway; and filling said at least one elongated passageway with a conductive material through said at least one opening and along said length to produce at least one electrical interconnect between at least two regions of said integrated circuit.

2. The process of claim 1, wherein said spaced adjacent conductive strips are constructed of polysilicon conductors and said conductive material is selected from the group consisting of doped polysilicon, metals, alloys, and metal silicides.

3. The process of claim 2, wherein said spaced adjacent conductive strips are deposited and formed by chemical vapor deposition.

4. The process of claim 1, further comprising depositing and densifying at least one more doped glass layer over said deposited and reflowed doped glass layer.

5. The process of claim 4, wherein said at least one more doped glass layer is deposited and formed by chemical vapor deposition.

6. The process of claim 1, further comprising depositing an oxide layer over said spaced adjacent conductive strips prior to said depositing said doped glass layer.

7. The process of claim 6, wherein said oxide layer is deposited and formed by chemical vapor deposition.

8. The process of claim 1, wherein said filling comprises connecting at least one via to at least one opening to direct said conductive material into said at least one elongated passageway simultaneously with metallization.

9. The process of claim 8, wherein said conductive material fills said at least one elongated passageway by chemical vapor deposition.

10. The process of claim 1, wherein said forming said at least one opening comprises connecting at least one via to said at least one elongated passageway to direct said conductive material into said at least one elongated passageway simultaneously with metallization.

11. The process of claim 10, wherein said conductive material fills said at least one elongated passageway by chemical vapor deposition.

12. The process of claim 1, further comprising forming multi-level electrical interconnections by approximately simultaneously connecting said at least one electrical interconnect with said at least two regions in at least one level of said integrated circuit during metallization.

13. The process of claim 12, wherein said conductive material fills said at least one elongated passageway by chemical vapor deposition.

14. The process of claim 1, wherein said doped glass layer is deposited and formed by chemical vapor deposition.

15. The process of claim 1, wherein said conductive material fills said at least one elongated passageway by chemical vapor deposition.

16. The process of claim 1, wherein said reflowing positions said at least one elongated passageway at a distance from said coated substrate surfaces and said coated strips sufficient to prevent damage to said coated substrate surfaces and said coated strips when said at least one electrical interconnect is produced.

17. A process for forming electrical interconnects in integrated circuits comprising:

forming adjacent conductive strips on a substrate surface;

depositing an insulating layer over a strip surface of said adjacent conductive strips and on said substrate surface located between said adjacent conductive strips to form coated strip surfaces and coated substrate surfaces, said insulating layer deposited to a thickness sufficient to form at least one elongated passageway having at least one opening, said at least one elongated passageway being located between and running along a lengthwise distance of said adjacent conductive strips above said coated substrate surfaces, said insulating layer is selected from the group consisting of borophosphosilica glass, borosilicate glass, phosphosilicate glass, and silicon dioxide;

reflowing said deposited insulating layer to smooth said deposited insulating layer and to position said at least one elongated passageway; and depositing a conductive material into said at least one opening by chemical vapor deposition and throughout said at least one elongated passageway to form an electrical interconnect extending therein.

18. The process of claim 17, wherein said insulating layer comprises an insulation layer deposited and formed by chemical vapor deposition.

19. The process of claim 18, further comprising depositing and densifying at least one more insulating layer over said deposited and reflowed insulating layer, said at least one more insulating layer being deposited by chemical vapor deposition.

20. The process of claim 18, further comprising depositing an oxide layer over said adjacent conductive strips prior to said depositing said insulating layer by chemical vapor deposition.

21. The process of claim 17, wherein said adjacent conductive strips are constructed of polysilicon conductors and said conductive material is selected from the group consisting of doped polysilicon, metals, alloys, and metal silicides, said adjacent conductive strips being formed by chemical vapor deposition.

22. The process of claim 17, wherein said depositing said conductive material further comprises connecting at least one via to said at least one opening to direct said conductive material into said at least one elongated passageway simultaneously with metallization.

23. The process of claim 17, further comprising forming said at least one opening by connecting at least one via to said at least one elongated passageway to direct said conductive material into said at least one elongated passageway simultaneously with metallization.

24. The process of claim 17, further comprising forming multi-level electrical interconnections by approximately simultaneously connecting each said electrical interconnect with at least two regions in at least one level of said integrated circuits during metallization.

25. The process of claim 17, wherein said reflowing said deposited insulating layer positions said at least one elongated passageway at a distance from said coated substrate surfaces and said coated adjacent conductive strips sufficient to prevent damage to said coated substrate surfaces and said coated adjacent conductive strips when each said electrical interconnect is formed.

26. The process of claim 17, wherein said depositing said insulating layer is performed until said thickness is proportional to a spacing between said adjacent conductive strips.

* * * * *

UNITED STATES PATENT AND TRADEMARK OFFICE
CERTIFICATE OF CORRECTION

PATENT NO. : 6,479,378 B1 Page 1 of 1
DATED : November 12, 2002
INVENTOR(S) : Philip J. Ireland It is certified that error appears in the above-identified patent and that said Letters Patent is hereby corrected as shown below:

Title page, Item [54] and Column 1, lines 1-3,
Change "PROCESS FOR FORMING ELECTRICAL INTERCONNECTS IN INTEGRATED CIRCUITS" to -- CREATION OF SUBRESOLUTION FEATURES VIA FLOW CHARACTERISTICS --

Column 1,
Lines 8-9, change "6,365,489, pending." to -- 6,365,489. --

Column 4,
Line 52, change "(BP SG) to -- (BPSG) -- and change "(BSG)" to -- (BSG) --

Column 7,
Line 13, change "conductive strip 98" to -- crossover conductor 98 --

Signed and Sealed this

Twenty-ninth Day of July, 2003

JAMES E. ROGAN
*Director of the United States Patent and Trademark Office*